US007864188B2

(12) United States Patent
Higgins et al.

(10) Patent No.: US 7,864,188 B2

(45) Date of Patent: Jan. 4, 2011

(54) SYSTEMS AND METHODS FOR SELECTING A WHITE POINT FOR IMAGE DISPLAYS

(75) Inventors: Michael Francis Higgins, Cazadero, CA (US); Candice Hellen Brown Elliott, Santa Rosa, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/873,221

(22) Filed: Oct. 16, 2007

(65) Prior Publication Data

US 2008/0030518 A1 Feb. 7, 2008

Related U.S. Application Data

(62) Division of application No. 10/821,386, filed on Apr. 9, 2004, now Pat. No. 7,301,543.

(51) Int. Cl.

*G09G 5/00* (2006.01)
*G09G 5/02* (2006.01)
*H04N 1/46* (2006.01)
*G03F 3/08* (2006.01)
*G06K 9/32* (2006.01)

(52) U.S. Cl. ........................ 345/589; 345/600; 345/590; 345/639; 345/643; 358/516; 358/518; 382/162; 382/167

(58) Field of Classification Search ................... 702/88; 348/E9.01

See application file for complete search history.

(56) References Cited

U.S. PATENT DOCUMENTS 4,439,759 A 3/1984 Fleming et al.
4,737,843 A 4/1988 Spencer
4,751,535 A 6/1988 Myers
4,946,259 A 8/1990 Matino et al.
4,989,079 A 1/1991 Ito
5,311,295 A 5/1994 Tallman et al.
5,341,153 A 8/1994 Benzschawel et al.
5,398,066 A 3/1995 Martinez-Uriegas et al.
5,416,890 A 5/1995 Beretta
5,448,652 A 9/1995 Vaidyanathan et al.
5,450,216 A 9/1995 Kasson
5,642,176 A 6/1997 Abukawa et al.
5,661,371 A 8/1997 Salerno et al.
5,668,890 A 9/1997 Winkelman (Continued)

FOREIGN PATENT DOCUMENTS

GB 2 282 928 A 4/1995

(Continued)

OTHER PUBLICATIONS

Betrisey, C., et al., Displaced Filtering for Patterned Displays, SID Symp. Digest 1999, pp. 296-299.

(Continued)

*Primary Examiner*—Sajous Wesner
(74) *Attorney, Agent, or Firm*—Innovation Counsel LLP

(57) ABSTRACT

Several embodiments of the present application disclose techniques, systems and methods for changing or rendering input image data that may assume a first white point for a given display into image data to be rendered under a second—assumed, desired or measured—white point of the display.

3 Claims, 5 Drawing Sheets

U.S. PATENT DOCUMENTS 5,694,186 A 12/1997 Yanagawa et al.
5,719,639 A 2/1998 Imamura
5,724,112 A 3/1998 Yoshida et al.
5,724,442 A 3/1998 Ogatsu et al.
5,731,818 A 3/1998 Wan et al.
5,748,828 A 5/1998 Steiner et al.
5,751,268 A 5/1998 Sheridon
5,821,913 A 10/1998 Mamiya
5,880,707 A 3/1999 Aratani
5,899,550 A 5/1999 Masaki
5,903,366 A 5/1999 Hirabayashi et al.
5,917,556 A 6/1999 Katayama
5,929,843 A 7/1999 Tanioka
5,933,253 A 8/1999 Ito et al.
5,937,089 A 8/1999 Kobayashi
5,949,496 A 9/1999 Kim
5,963,263 A 10/1999 Shyu
5,987,165 A 11/1999 Matsuzaki et al.
5,990,997 A 11/1999 Jones et al.
5,995,669 A 11/1999 Shingu et al.
6,005,968 A 12/1999 Granger
6,023,527 A 2/2000 Narahara
6,054,832 A 4/2000 Kunzman et al.
6,097,367 A 8/2000 Kuriwaki et al.
6,100,872 A 8/2000 Aratani et al.
6,108,053 A 8/2000 Pettitt et al.
6,137,560 A 10/2000 Utsumi et al.
6,147,664 A 11/2000 Hansen
6,147,728 A 11/2000 Okumura et al.
6,256,425 B1 7/2001 Kunzman
6,262,698 B1 7/2001 Blum
6,262,710 B1 7/2001 Smith
6,278,434 B1 8/2001 Hill et al.
6,297,826 B1 10/2001 Semba et al.
6,360,008 B1 3/2002 Suzuki et al.
6,360,023 B1 3/2002 Betrisey et al.
6,384,836 B1 5/2002 Naylor, Jr. et al.
6,393,145 B2 5/2002 Betrisey et al.
6,421,142 B1 7/2002 Lin et al.
6,453,067 B1 9/2002 Morgan et al.
6,459,419 B1 10/2002 Matsubayashi
6,483,518 B1 11/2002 Perry et al.
6,536,904 B2 3/2003 Kunzman
6,614,414 B2 9/2003 De Haan et al.
6,633,302 B1 10/2003 Ohsawa et al.
6,707,463 B1 3/2004 Gibson et al.
6,714,212 B1 3/2004 Tsuboyama et al.
6,714,243 B1 3/2004 Mathur et al.
6,724,934 B1 4/2004 Lee et al.
6,738,526 B1 5/2004 Betrisey et al.
6,750,874 B1 6/2004 Kim
6,771,028 B1 8/2004 Winters
6,781,626 B1 8/2004 Wang
6,809,714 B1* 10/2004 Yamauchi et al. ............. 345/88
6,870,523 B1 3/2005 Ben-David et al.
6,885,380 B1 4/2005 Primerano et al.
6,897,876 B2 5/2005 Murdoch et al.
6,903,378 B2 6/2005 Cok
6,937,217 B2 8/2005 Klompenhouwer et al.
6,980,219 B2 12/2005 Higgins
7,027,105 B2 4/2006 Lee et al.
7,129,955 B2 10/2006 Motomura
7,176,935 B2 2/2007 Higgins
7,184,067 B2 2/2007 Miller et al.
7,301,543 B2 11/2007 Higgins
2001/0019382 A1 9/2001 Song et al.
2001/0048764 A1 12/2001 Betrisey et al.
2002/0063670 A1 5/2002 Yoshinaga et al.
2002/0097907 A1* 7/2002 Fukasawa ................... 382/167
2002/0180688 A1 12/2002 Drzaic et al.
2002/0191130 A1 12/2002 Liang et al.
2003/0043166 A1* 3/2003 Kumada et al. ............. 345/589
2003/0058466 A1 3/2003 Hoshuyama
2003/0112454 A1 6/2003 Woolfe et al.
2003/0117457 A1 6/2003 Qiao
2003/0128872 A1 7/2003 Lee et al.
2003/0151694 A1 8/2003 Lee et al.
2003/0179212 A1 9/2003 Matsushiro et al.
2003/0193056 A1 10/2003 Takayama et al.
2003/0214499 A1 11/2003 Ohsawa et al.
2004/0021804 A1 2/2004 Hong et al.
2004/0046725 A1 3/2004 Lee
2004/0072380 A1 4/2004 Yamazaki et al.
2004/0095521 A1 5/2004 Song et al.
2004/0111435 A1 6/2004 Herbert et al.
2004/0114046 A1 6/2004 Lee et al.
2004/0169807 A1 9/2004 Rho et al.
2004/0179160 A1 9/2004 Rhee et al.
2004/0195963 A1 10/2004 Choi et al.
2004/0199346 A1* 10/2004 Stokes ......................... 702/88
2004/0218811 A1* 11/2004 Edge et al. .................. 382/162
2004/0222999 A1 11/2004 Choi et al.
2004/0223005 A1 11/2004 Lee
2004/0239813 A1 12/2004 Klompenhouwer
2005/0024734 A1 2/2005 Richards et al.
2005/0031199 A1 2/2005 Ben-Chorin et al.
2005/0078122 A1* 4/2005 Ohga ......................... 345/589
2005/0083341 A1 4/2005 Higgins et al.
2005/0083344 A1 4/2005 Higgins
2005/0083345 A1* 4/2005 Higgins ...................... 345/600
2005/0083352 A1 4/2005 Higgins
2005/0094871 A1 5/2005 Berns et al.
2005/0105147 A1 5/2005 Gruzdev et al.
2005/0149864 A1* 7/2005 Matsuzaki et al. .......... 715/528
2005/0152597 A1 7/2005 Spaulding et al.
2005/0212728 A1 9/2005 Miller et al.
2005/0219274 A1 10/2005 Yang et al.
2005/0225561 A1 10/2005 Higgins et al.
2005/0225562 A1 10/2005 Higgins et al.
2005/0264580 A1* 12/2005 Higgins ...................... 345/589
2006/0221093 A1* 10/2006 Holub ........................ 345/589
2006/0244686 A1 11/2006 Higgins et al.

FOREIGN PATENT DOCUMENTS

JP 6-261332 9/1994
JP 08-202317 8/1996
JP 09-325332 12/1997
JP 2001-119717 4/2001
TW 483283 4/2002
TW 548509 8/2003
WO WO 00/42762 7/2000
WO WO 01/37251 A1 5/2001
WO WO 2004/040548 5/2004
WO WO 2005/050296 A1 6/2005
WO WO 2005/076257 A2 8/2005

OTHER PUBLICATIONS

Brown Elliott, C., "Active Matrix Display . . . ", IDMC 2000, 185-189, Aug. 2000.

Brown Elliott, C., "Color Subpixel Rendering Projectors and Flat Panel Displays," SMPTE, Feb. 27-Mar. 1, 2003, Seattle, WA pp. 1-4.

Brown Elliott, C, "Co-Optimization of Color AMLCD Subpixel Architecture and Rendering Algorithms," SID 2002 Proceedings Paper, May 30, 2002 pp. 172-175.

Brown Elliott, C, "Development of the PenTile Matrix™ Color AMLCD Subpixel Architecture and Rendering Algorithms", SID 2003, Journal Article.

Brown Elliott, C, "New Pixel Layout for PenTile Matrix™ Architecture", IDMC 2002, pp. 115-117.

Brown Elliott, C, "Reducing Pixel Count Without Reducing Image Quality", Information Display Dec. 1999, vol. 1, pp. 22-25.

Credelle, Thomas, "P-00: MTF of High-Resolution PenTile Matrix Displays", Eurodisplay 02 Digest, 2002 pp. 1-4.

Klompenhouwer, Michiel, Subpixel Image Scaling for Color Matrix Displays, SID Symp. Digest, May 2002, pp. 176-179.
Michiel A. Klompenhouwer, Gerard de Haan, Subpixel image scaling for color matrix displays, Journal of the Society for Information Display, vol. 11, Issue 1, Mar. 2003, pp. 99-108.
Krantz, John et al., Color Matrix Display Image Quality: The Effects of Luminance . . . SID 90 Digest, pp. 29-32, 1990.
Messing, Dean et al., Improved Display Resolution of Subsampled Colour Images Using Subpixel Addressing, IEEE ICIP 2002, vol. 1, pp. 625-628.
Messing, Dean et al., Subpixel Rendering on Non-Striped Colour Matrix Displays, 2003 International Conf on Image Processing, Sep. 2003, Barcelona, Spain, 4 pages.
Morovic, J., Gamut Mapping, in Digital Color Imaging Handbook, ed. G. Sharma, Boca Raton, FL: CRC Press, Dec. 2002, Chapter 10, pp. 635-682.
Murch, M., "Visual Perception Basics," SID Seminar, 1987, Tektronix Inc, Beaverton Oregon.
PCT International Search Report dated Jun. 26, 2008 for PCT/US04/33705 (U.S. Appl. No. 10/691,377).
PCT International Search Report dated May 21, 2007 for PCT/US04/33709 (U.S. Appl. No. 10/691,396).
PCT International Search Report dated Apr. 26, 2005 for PCT/US04/33743 (U.S. Patent No. 7,176,935).
PCT International Search Report dated May 21, 2008 for PCT/US05/09536 (U.S. Appl. No. 10/821,386).
PCT International Search Report dated Jun. 21, 2006 for PCT/US05/01002 (U.S. Appl. No. 10/821,306).

* cited by examiner

SYSTEMS AND METHODS FOR SELECTING A WHITE POINT FOR IMAGE DISPLAYS

BACKGROUND

In commonly owned United States patent Applications and patents: (1) U.S. patent application Ser. No. 09/916,232 ("the '232 application"), entitled "ARRANGEMENT OF COLOR PIXELS FOR FULL COLOR IMAGING DEVICES WITH SIMPLIFIED ADDRESSING," filed Jul. 25, 2001, now issued as U.S. Pat. No. 6,903,754; (2) U.S. patent application Ser. No. 10/278,353 ("the '353 application"), entitled "IMPROVEMENTS TO COLOR FLAT PANEL DISPLAY SUB-PIXEL ARRANGEMENTS AND LAYOUTS FOR SUB-PIXEL RENDERING WITH INCREASED MODULATION TRANSFER FUNCTION RESPONSE," filed Oct. 22, 2002, and published as United States Patent Application Publication No. 2003/0128225; (3) U.S. patent application Ser. No. 10/278,352 ("the '352 application"), entitled "IMPROVEMENTS TO COLOR FLAT PANEL DISPLAY SUB-PIXEL ARRANGEMENTS AND LAYOUTS FOR SUB-PIXEL RENDERING WITH SPLIT BLUE SUB-PIXELS," filed Oct. 22, 2002, and published as United States Patent Application Publication No. 2003/0128179; (4) U.S. patent application Ser. No. 10/243,094 ("the '094 application), entitled "IMPROVED FOUR COLOR ARRANGEMENTS AND EMITTERS FOR SUB-PIXEL RENDERING," filed Sep. 13, 2002, and published as United States Patent Application Publication No. 2004/0051724; (5) U.S. patent application Ser. No. 10/278,328 ("the '328 application"), entitled "IMPROVEMENTS TO COLOR FLAT PANEL DISPLAY SUB-PIXEL ARRANGEMENTS AND LAYOUTS WITH REDUCED BLUE LUMINANCE WELL VISIBILITY," filed Oct. 22, 2002, and published as United States Patent Application Publication No. 2003/0117423; (6) U.S. patent application Ser. No. 10/278,393 ("the '393 application"), entitled "COLOR DISPLAY HAVING HORIZONTAL SUB-PIXEL ARRANGEMENTS AND LAYOUTS," filed Oct. 22, 2002, and published as United States Patent Application Publication No. 2003/0090581; and (7) U.S. patent application Ser. No. 10/347,001 ("the '001 application") entitled "IMPROVED SUB-PIXEL ARRANGEMENTS FOR STRIPED DISPLAYS AND METHODS AND SYSTEMS FOR SUB-PIXEL RENDERING SAME," filed Jan. 16, 2003, and published as United States Patent Application Publication No. 2004/0080479, each of which is herein incorporated by reference in its entirety, novel subpixel arrangements are disclosed for improving the cost/performance curves for image display devices.

For certain subpixel repeating groups having an even number of subpixels in a horizontal direction, the following systems and techniques to affect proper dot inversion schemes are disclosed and these applications and patents are herein incorporated by reference: (1) U.S. patent application Ser. No. 10/456,839 entitled "IMAGE DEGRADATION CORRECTION IN NOVEL LIQUID CRYSTAL DISPLAYS" and published as United States Patent Application Publication No. 2004/0246280; (2) U.S. patent application Ser. No. 10/455,925 entitled "DISPLAY PANEL HAVING CROSSOVER CONNECTIONS EFFECTING DOT INVERSION" and published as United States Patent Application Publication No. 2004/0246213; (3) U.S. patent application Ser. No. 10/455,931 entitled "SYSTEM AND METHOD OF PERFORMING DOT INVERSION WITH STANDARD DRIVERS AND BACKPLANE ON NOVEL DISPLAY PANEL LAYOUTS" and issued as U.S. Pat. No. 7,218,301; (4) U.S. patent application Ser. No. 10/455,927 entitled "SYSTEM AND METHOD FOR COMPENSATING FOR VISUAL EFFECTS UPON PANELS HAVING FIXED PATTERN NOISE WITH REDUCED QUANTIZATION ERROR" and issued as U.S. Pat. No. 7,209,105; (5) U.S. patent application Ser. No. 10/456,806 entitled "DOT INVERSION ON NOVEL DISPLAY PANEL LAYOUTS WITH EXTRA DRIVERS" and issued as U.S. Pat. No. 7,187,353; and (6) U.S. patent application Ser. No. 10/456,838 entitled "LIQUID CRYSTAL DISPLAY BACKPLANE LAYOUTS AND ADDRESSING FOR NON-STANDARD SUBPIXEL ARRANGEMENTS" and published as United States Patent Application Publication No. 2004/0246404; and (7) U.S. patent application Ser. No. 10/696,236 entitled "IMAGE DEGRADATION CORRECTION IN NOVEL LIQUID CRYSTAL DISPLAYS WITH SPLIT BLUE SUBPIXELS", filed Oct. 28, 2003, and published as United States Patent Application Publication No. 2005/0083277; and (8) U.S. patent application Ser. No. 10/807,604 entitled "IMPROVED TRANSISTOR BACKPLANESFOR LIQUID CRYSTAL DISPLAYS COMPRISING DIFFERENT SIXED SUBPIXELS", filed Mar. 23, 2004 and published as U.S. Pat. No. 7,268,758.

These improvements are particularly pronounced when coupled with sub-pixel rendering (SPR) systems and methods further disclosed in those applications and in commonly owned United States patent Applications and patents: (1) U.S. patent application Ser. No. 10/051,612 ("the '612 application"), entitled "CONVERSION OF A SUB_PIXEL FORMAT DATA TO ANOTHER SUB-PIXEL DATA FORMAT," filed Jan. 16, 2002, and now issued as U.S. Pat. No. 7,123,277; (2) U.S. patent application Ser. No. 10/150,355 ("the '355 application"), entitled "METHODS AND SYSTEMS FOR SUB-PIXEL RENDERING WITH GAMMA ADJUSTMENT," filed May 17, 2002, and now issued as U.S. Pat. No. 7,221,381; (3) U.S. patent application Ser. No. 10/215,843 ("the '843 application"), entitled "METHODS AND SYSTEMS FOR SUB-PIXEL RENDERING WITH ADAPTIVE FILTERING," filed Aug. 8, 2002 and now issued as U.S. Pat. No. 7,184,066; (4) U.S. patent application Ser. No. 10/379,767 entitled "SYSTEMS AND METHODS FOR TEMPORAL SUB-PIXEL RENDERING OF IMAGE DATA" filed Mar. 4, 2003 and published as United States patent Application Publication No. 2004/0196302; (5) U.S. patent application Ser. No. 10/379,765 entitled "SYSTEMS AND METHODS FOR MOTION ADAPTIVE FILTERING," filed Mar. 4, 2003 and now issued as U.S. Pat. No. 7,167,186; (6) U.S. patent application Ser. No. 10/379,766 entitled "SUB-PIXEL RENDERING SYSTEM AND METHOD FOR IMPROVED DISPLAY VIEWING ANGLES" filed Mar. 4, 2003 and now issued as U.S. Pat. No. 6,917,368; and (7) U.S. patent application Ser. No. 10/409,413 entitled "IMAGE DATA SET WITH EMBEDDED PRE-SUBPIXEL RENDERED IMAGE" filed Apr. 7, 2003 and published as United States Patent Application Publication No. 2004/0196297, which are hereby incorporated herein by reference in their entirety.

Improvements in gamut conversion and mapping are disclosed in commonly owned and co-pending United States patent Applications and patents: (1) U.S. patent application Ser. No. 10/691,200 entitled "HUE ANGLE CALCULATION SYSTEM AND METHODS", filed Oct. 21, 2003 and issued as U.S. Pat. No. 6,980,219; (2) U.S. patent application Ser. No. 10/691,377 entitled "METHOD AND APPARATUS FOR CONVERTING FROM SOURCE COLOR SPACE TO RGBW TARGET COLOR SPACE", filed Oct. 21, 2003 and published as United States Patent Application Publication No. 2005/0083341; (3) U.S. patent application Ser. No.

10/691,396 entitled "METHOD AND APPARATUS FOR CONVERTING FROM A SOURCE COLOR SPACE TO A TARGET COLOR SPACE", filed Oct. 21, 2003 and published as United States Patent Application Publication No. 2005/0083352; and (4) U.S. patent application Ser. No. 10/690,716 entitled "GAMUT CONVERSION SYSTEM AND METHODS" and issued as U.S. Pat. No. 7,176,935 which are all hereby incorporated herein by reference in their entirety.

Additional advantages have been described in (1) U.S. patent application Ser. No. 10/696,235 entitled "DISPLAY SYSTEM HAVING IMPROVED MULTIPLE MODES FOR DISPLAYING IMAGE DATA FROM MULTIPLE INPUT SOURCE FORMATS", filed Oct. 28, 2003 and issued as U.S. Pat. No. 7,084,923 (2) U.S. patent application Ser. No. 10/696,026 entitled "SYSTEM AND METHOD FOR PERFORMING IMAGE RECONSTRUCTION AND SUB-PIXEL RENDERING TO EFFECT SCALING FOR MULTI-MODE DISPLAY" filed Oct. 28, 2003 and published as United States Patent Application Publication No. 2005/0088385; which are all hereby incorporated by reference. All patent applications mentioned in this specification are hereby incorporated by reference in their entirety.

Additionally, these co-owned and co-pending applications are herein incorporated by reference in their entirety: (1) U.S. patent application Ser. No. 10/821,387 entitled "SYSTEM AND METHOD FOR IMPROVING SUB-PIXEL RENDERING OF IMAGE DATA IN NON-STRIPED DISPLAY SYSTEMS", and published as United States Patent Application Publication No. 2005/0225548; (2) U.S. patent application Ser. No. 10/821,353 entitled "NOVEL SUBPIXEL LAYOUTS AND ARRANGEMENTS FOR HIGH BRIGHTNESS DISPLAYS", and published as United States Patent Application Publication No. 2005/0225574; (3) U.S. patent application Ser. No. 10/821,306 entitled "SYSTEMS AND METHODS FOR IMPROVED GAMUT MAPPING FROM ONE IMAGE DATA SET TO ANOTHER", and published as United States Patent Application Publication No. 2005/0225562; (4) U.S. patent application Ser. No. 10/821,388 entitled "IMPROVED SUBPIXEL RENDERING FILTERS FOR HIGH BRIGHTNESS SUBPIXEL LAYOUTS", and published as U.S. Pat. No. 7,248,268; which are all hereby incorporated by reference. All patent applications mentioned in this specification are hereby incorporated by reference in their entirety.

BRIEF DESCRIPTION OF THE DRAWINGS

The accompanying drawings, which are incorporated in, and constitute a part of this specification illustrate exemplary implementations and embodiments of the invention and, together with the description, serve to explain principles of the invention.

DETAILED DESCRIPTION

Reference will now be made in detail to implementations and embodiments, examples of which are illustrated in the accompanying drawings. Wherever possible, the same reference numbers will be used throughout the drawings to refer to the same or like parts.

The white point of an image display does not always turn out to be a desirable color. This can be corrected by changing the color temperature of the backlight but that could be expensive. Additionally, some monitors have a user control that allows changing the white point to make all images display "warmer" or "cooler". The several embodiments of the present invention disclosed herein show systems and methods of changing the white point to any desired color without needing to change the backlight. The present embodiments and techniques are applicable to a full range of image displays—in particular, multi-primary displays, RGBW displays, as well as RGB primary displays. In the case of multi-primary and RGBW systems, these systems typically use conversion matrices, and changing such matrices may effect a change in the white point of a display—without the need for an expensive change in the backlight.

The difference between the measured and desired white point of a display could potentially introduce errors into chromaticity triangle number calculation. This might result in the wrong conversion being applied to some input colors. The present invention described herein substantially corrects for this error, as will be disclosed below.

Figure 1:
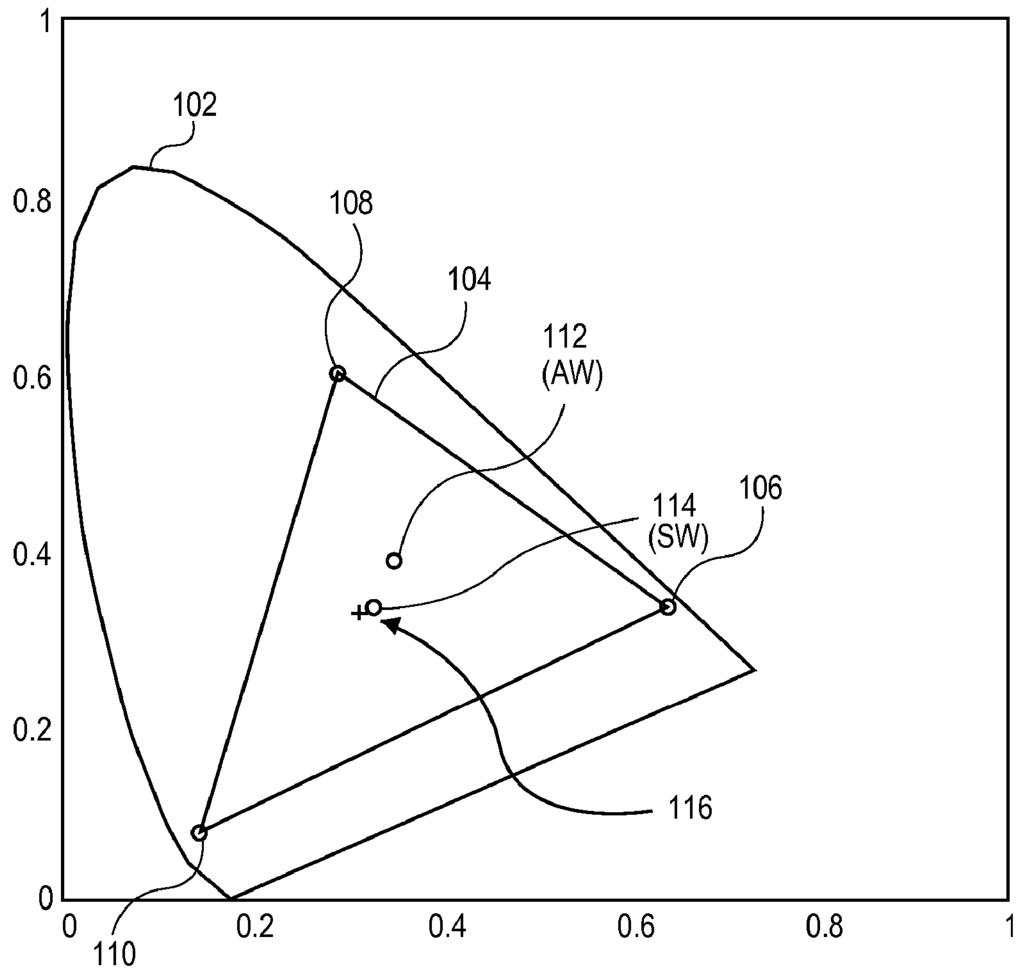
FIG. 1 is a chromaticity diagram showing measurements of an RGBW display.

Choosing the Correct White Point:

In the case of a multi-primary system that includes a white sub-pixel, there may be multiple white points from which to choose. FIG. 1 depicts a standard chromaticity diagram wherein envelope 102 represents the spectral locus and the "line of purples" that encloses all the observable colors. Within this envelope 102, a triangular region 104 represents a typical monitor gamut which encloses all of the colors that might be displayable by a monitor, television or some other image rendering device. The region 104 is depicted here as triangular—primarily assuming that the image display device employs three primary color points: red 106, green 108, and blue 110 apart from a white subpixel.

Within this region, there are at least two measurable white points—white point 112 (herein called the "AW" point) which arises from all three colored primaries turned on; and white point 114 (herein called the "SW" point) which arises from turning on only the white subpixels. Additionally, there may be yet another "desired" white point 116 (e.g. D65). Depending upon the intent, these three different white points may each be used for different purposes. For one example, a white point may be desired because it is the assumed white point of the input image data. This white point may be different from the measured white point of the image display.

Using RGBW as an example, the following equation is the constraint used to numerically solve for the C weighting coefficients:

$$\begin{bmatrix} (x_r \cdot C_r + x_g \cdot C_g + x_b \cdot C_b + x_{SW} \cdot C_w)^2 \\ (y_r \cdot C_r + y_g \cdot C_g + y_b \cdot C_b + y_{SW} \cdot C_w)^2 \\ (z_r \cdot C_r + z_g \cdot C_g + z_b \cdot C_b + z_{SW} \cdot C_w)^2 \end{bmatrix} = \begin{bmatrix} (AW_X)^2 \\ (AW_Y)^2 \\ (AW_Z)^2 \end{bmatrix} \quad \text{Equation 1}$$

The notation $x_{SW}$, $y_{SW}$ and $z_{SW}$ refer to the CIE xyz chromaticity values for the SW measured white sub-pixel. While the notation $AW_X$, $AW_Y$ and $AW_Z$ refer to the CIE XYZ tri-stimulus values for the AW measured white with all the primaries on full.

Equation 1 may be used to solve for the values of the $C_r$ $C_g$ $C_b$ and $C_w$ weighting coefficients, then these may be used with the primary chromaticity values to create an equation to convert RGBW values into CIE XYZ tri-stimulus values. For a multi-primary system with more primaries, there would simply be more "columns" in the equation. For example, a display with a cyan primary would have measured chromaticity values $x_c$ $y_c$ and $z_c$. Then there would also be an additional weight coefficient $C_c$ to solve for. In the case of a multi-primary display without a white sub-pixel, there would be no column with $x_{SW}$, $y_{SW}$ and $z_{SW}$ values and no $C_w$ coefficient to solve for. It should be appreciated that the term "column" is used loosely here. Equation 1 is a matrix with only one column in it, but it is derived from a matrix with a separate column for each primary.

The weight coefficients from equation 1 may be used to build a matrix for converting RGBW (or other multi-primary systems) into CIE XYZ. This in turn may be used to create a set of matrices for converting CIE XYX value into RGBW (or other multi-primary systems). These matrices may be combined with conversion matrices that convert source data, for example sRGB, to and from CIE XYZ. Then it is possible, with a single matrix multiply, to convert source data directly to any multi-primary system.

Equation 1 uses the measured SW chromaticity of the white sub pixel and the measured AW tri-stimulus values of the white point. This produces the mathematically correct conversion, but with results that sometimes may seem unexpected. For example, if the input data is sRGB, then it has the D65 white point assumption. However if the white point AW of a multi-primary display is not D65, then the sRGB white value (255,255,255) will not result in a multi-primary value of (255,255,255,255). It is usually expected that the brightest possible input value to result in the brightest possible output value. However, that "brightest possible" result may not always give the correct color. If that color error is not acceptable, one solution that has been used is to replace AW in equation 1 with D65 resulting in the following equation:

$$\begin{bmatrix} (x_r \cdot C_r + x_g \cdot C_g + x_b \cdot C_b + x_{SW} \cdot C_w)^2 \\ (y_r \cdot C_r + y_g \cdot C_g + y_b \cdot C_b + y_{SW} \cdot C_w)^2 \\ (z_r \cdot C_r + z_g \cdot C_g + z_b \cdot C_b + z_{SW} \cdot C_w)^2 \end{bmatrix} = \begin{bmatrix} (D65_X)^2 \\ (D65_Y)^2 \\ (D65_Z)^2 \end{bmatrix} \quad \text{Equation 2}$$

When all the multi-primary matrices are re-calculated from this starting point, the resulting matrices have the "expected" result of converting sRGB (255,255,255) into the multi-primary values (255,255,255,255). If the measured AW white point is reasonably close to D65, this may be a reasonable approximation. Also, if the backlight is modified until the measured AW white point is in fact D65 then equation 2 is mathematically correct and so is the "expected" result. However this may require a special backlight that would add to the cost of the display.

Therefore, equation 1 may suffice as a starting point to build the conversion matrices. For example, using the measured chromaticity values from an RGBW panel in equation 1, when sRGB (255,255,255) is the input color, one example might produce an RGBW color of (176,186,451,451). This is out of gamut, so gamut clamping or scaling maybe used to bring it back into range. The result after this step is (99,105, 255,255). If this particular panel was known to have a very "warm" or yellow white point, then this conversion may work by leaving the white and blue sub-pixels on full while decreasing the red and green sub-pixel values. There is a color in sRGB that does map to the AW measured white point and comes close to having all the multi-primaries on full. By using the inverse conversion on the measured AW color and applying gamut clamping as required the sRGB color closest to "full on" turned out to be (255,244,135) on this particular RGBW display. This is a bright yellow color, as expected from the observation and measurement of the display white point.

Figure 2:
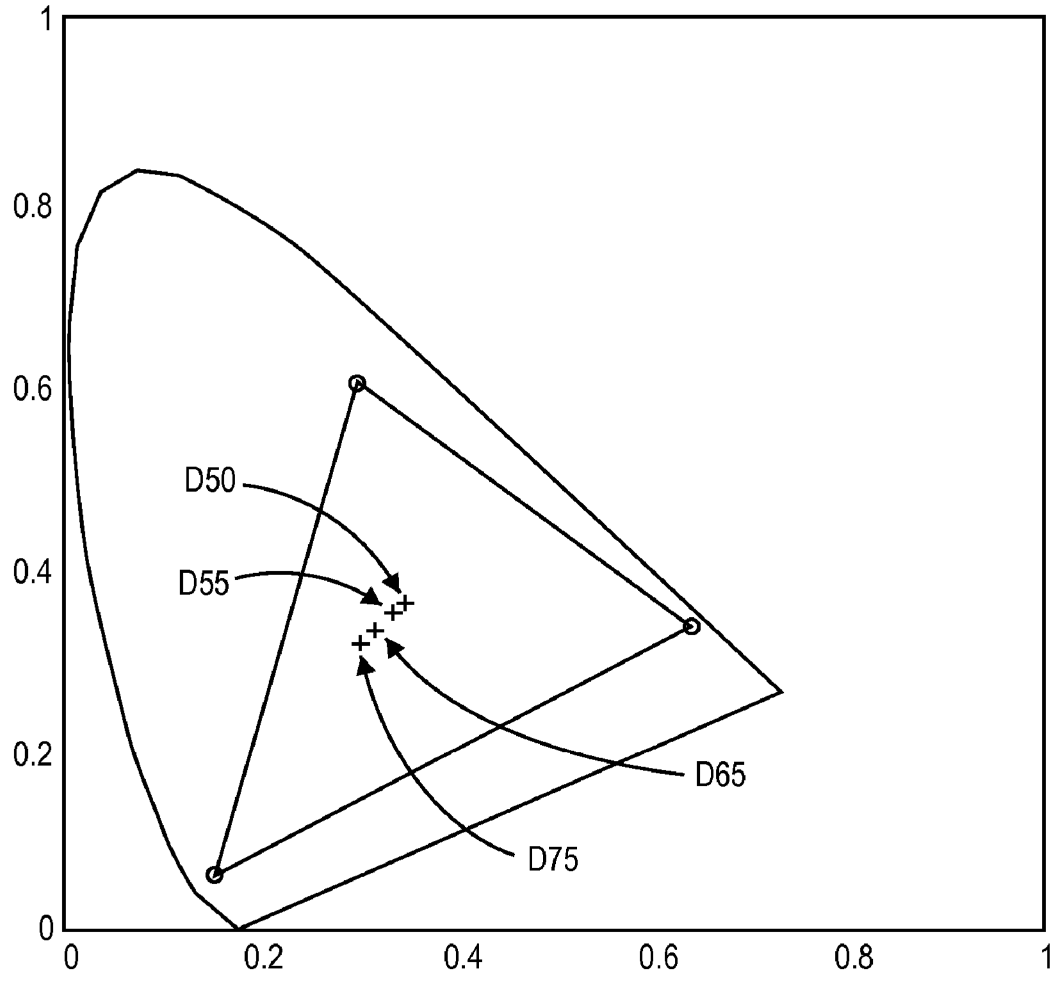
FIG. 2 is a chromaticity diagram showing several common standard white-points.

Choosing a Desired White Point:

It is often desirable to have controls on a monitor to change the "color temperature" of the display. For example, FIG. 2 depicts four possible desirable white points—D50, D55, D65, and D75. It will be understood that this list is not exhaustive and that there may be many other white points that could be "desired". Backlights exist for LCD displays that have a computer-controllable color temperature, but these are more expensive than fixed backlights. Changing the color temperature is equivalent to changing the desired white point of the display. Since the system may already be doing conversions from the source sRGB color space to the destination color space, the system may modify the conversion matrices to convert to a different desirable white point When building our conversion matrices, it is possible to combine the standard sRGB and CIE XYZ matrices. The standard sRGB matrix is shown below:

$$R2X = \begin{pmatrix} 0.485041 & 0.348893 & 0.130287 \\ 0.250099 & 0.697786 & 0.052115 \\ 0.022736 & 0.697786 & 0.686177 \end{pmatrix} \quad \text{Equation 3}$$

The matrix in equation 3 may be generated using a standard set of chromaticity values and the D65 white point. It is also possible to re-calculate a conversion matrix that assumes a different white point and use that instead of the standard matrix. Below the steps that suffice are shown:

$$C = \begin{pmatrix} 0.6400 & 0.3000 & 0.1500 \\ 0.3300 & 0.6000 & 0.0600 \\ 0.0300 & 0.1000 & 0.7900 \end{pmatrix}^{-1} \cdot D50 \quad \text{Equation 4}$$

$$R2X_{D50} = \begin{pmatrix} 0.6400C_r & 0.3000C_g & 0.1500C_b \\ 0.3300C_r & 0.6000C_g & 0.0600C_b \\ 0.0300C_r & 0.6000C_g & 0.7900C_b \end{pmatrix} \quad \text{Equation 5}$$

$$R2X_{D50} = \begin{pmatrix} 0.485041 & 0.348893 & 0.130287 \\ 0.250099 & 0.697786 & 0.052115 \\ 0.022736 & 0.697786 & 0.686177 \end{pmatrix} \quad \text{Equation 6}$$

In Equation 4, the matrix of standard chromaticity values for sRGB can be inverted and multiplied by the D50 CIE XYZ vector, for example, to produce the vector of weighting coefficients in one step.

In Equation 5, these weighting coefficients are inserted into the matrix of chromaticity values to produce a conversion matrix in another step. This matrix, its values shown in Equation 6, will convert sRGB values to CIE XYZ tri-stimulus values with the assumption that sRGB white will map to a desired white point, e.g. D50. To generate the RGBW conversion matrices, the matrix from Equation 6 may be used instead of the standard matrix from Equation 3. The result is a set of conversion matrices that convert sRGB to the multi-primary display with the colors modified to have the D50 white point. This process may be done with any desired white point. D50 is a "warmer" white point than the standard D65 white point. There are other standard defined white points. D75 is "cooler" than D65, D55 is between D50 and D65 in color temperature, Illuminant E and K (not shown in FIG. 2) are both cooler than D75, etc.

There are several alternative ways to present these white points in a monitor user interface. The conversion matrices for a list of standard white points, for example the ones listed above, could be pre-calculated and stored in a ROM or other computer storage device. The user selects from a list of white points by name. Selecting one causes the monitor to switch to the corresponding set of matrices and all images displayed become "warmer" or "cooler". Alternatively the matrices can be calculated based on the black body temperature of the white point. A list of color temperatures could be displayed for the user to select from. If enough matrices are pre-calculated at small enough steps, the user interface could give the illusion that the white point temperature can be changed continuously. Finally, if the display system has enough processing power to re-calculate the matrices on the fly, the user interface can in fact calculate a new set of conversion matrices every time the color temperature is changed.

Figure 3:
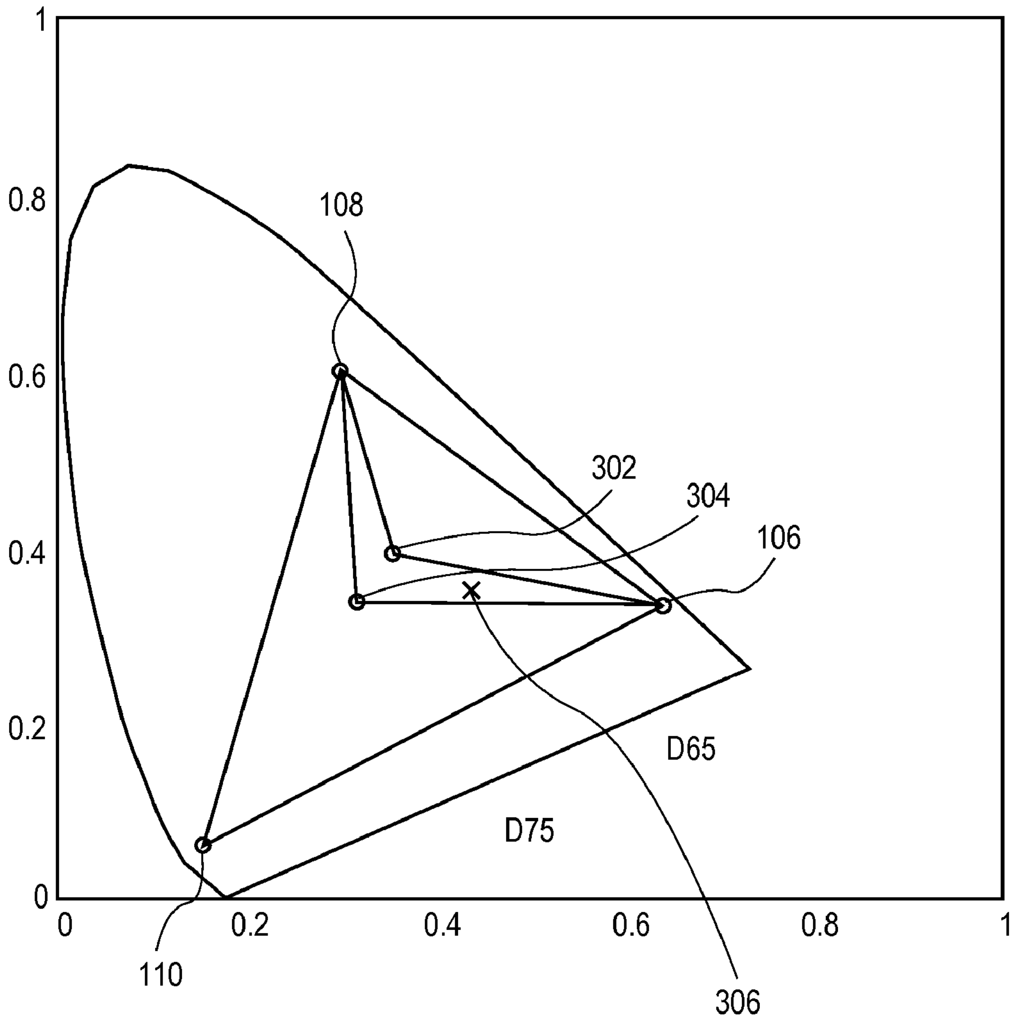
FIG. 3 is a diagram showing two chromaticity triangles comprising two different white points respectively.

Correcting the Chromaticity Triangle for the White Point:

In one embodiment, multi-primary conversion may employ determining which chromaticity triangle an input color lies in and using a different conversion matrix for each triangle. FIG. 3 shows one example of a plurality of chromaticity triangles that are based on two separate white points (302 and 304) and two color primaries. In this example, white point 302 could represent the measured white point while white point 304 might represent the desired white point. One way of determining the chromaticity triangle is to convert input colors to a separate chroma/luma colorspace, calculate the hue angle, and look the triangle number up in a table. However, if the white point of the display (e.g 302) is different from the white point of the input data (e.g. 304), then calculating the chromaticity triangles from the input data may result in errors. Colors that are close to the input white point may be assigned to the wrong chromaticity triangle. For example, as may be seen in FIG. 3, color point 306 might be construed as being contained within the triangle defined by white point 304 and color primaries 106 and 108; whereas with white point 302, color point 306 would now be construed as being contained within the triangle defined by white point 302 and color primaries 106 and 110.

One embodiment would be to convert the input colors to a different color space that has the same white point as the display and then calculate the chromaticity triangle. This solution may require a 3×3 matrix multiply. The input data is presumed to be sRGB, but any other input assumptions can be taken into account. A conversion matrix may thus be generated. This process is similar to the steps in equations 4 and 5 but using the AW measured white point (e.g. white point 302) of the display:

$$C = \begin{pmatrix} 0.6400 & 0.3000 & 0.1500 \\ 0.3300 & 0.6000 & 0.0600 \\ 0.0300 & 0.1000 & 0.7900 \end{pmatrix}^{-1} \cdot AW \quad \text{Equation 7}$$

$$R2X_{AW} = \begin{pmatrix} 0.6400C_r & 0.3000C_g & 0.1500C_b \\ 0.3300C_r & 0.6000C_g & 0.0600C_b \\ 0.0300C_r & 0.6000C_g & 0.7900C_b \end{pmatrix} \quad \text{Equation 8}$$

Equation 7 calculates the weighting coefficients that are used to create a conversion matrix in Equation 8. This matrix converts from a three-valued color space (not to be confused with the multi-primary color space) that has the measured white point into CIE XYZ. The inverse of this matrix times the standard sRGB matrix from Equation 3 will perform the conversion that suffices:

$$\begin{pmatrix} R_d \\ G_d \\ B_d \end{pmatrix} = (R2X_{AW})^{-1} \cdot R2X \cdot \begin{pmatrix} R \\ G \\ B \end{pmatrix} \quad \text{Equation 9}$$

In Equation 9, sRGB input values are converted to $R_dG_dB_d$ values that have the same white point as the display. These values may now be converted to chroma/luma, hue angle and chromaticity triangle number with substantially accuracy. The R2X and inverted $R2X_{AW}$ matrices can be combined into one pre-calculated matrix. It should be noted that this conversion may not be needed when the measured AW white point is close to D65.

Utilizing and Expanding Boolean Triangle Detector to Different White Points:

Another embodiment for calculating chromaticity triangle number for an RGBW multi-primary display may be effected by performing Boolean operations on the source sRGB values. This may be easier than the hue angle calculation, but it may have some limitations with systems using other than the 3 RGB primary colors. If the white-point is not taken into account, it might produce the incorrect triangle number in some cases, unless the display white point was D65 or the input values were corrected first, as described above. The triangle number calculation involved Boolean tests of the form:

if R<=B and G>=B then triangle=RGW.

Figure 4:
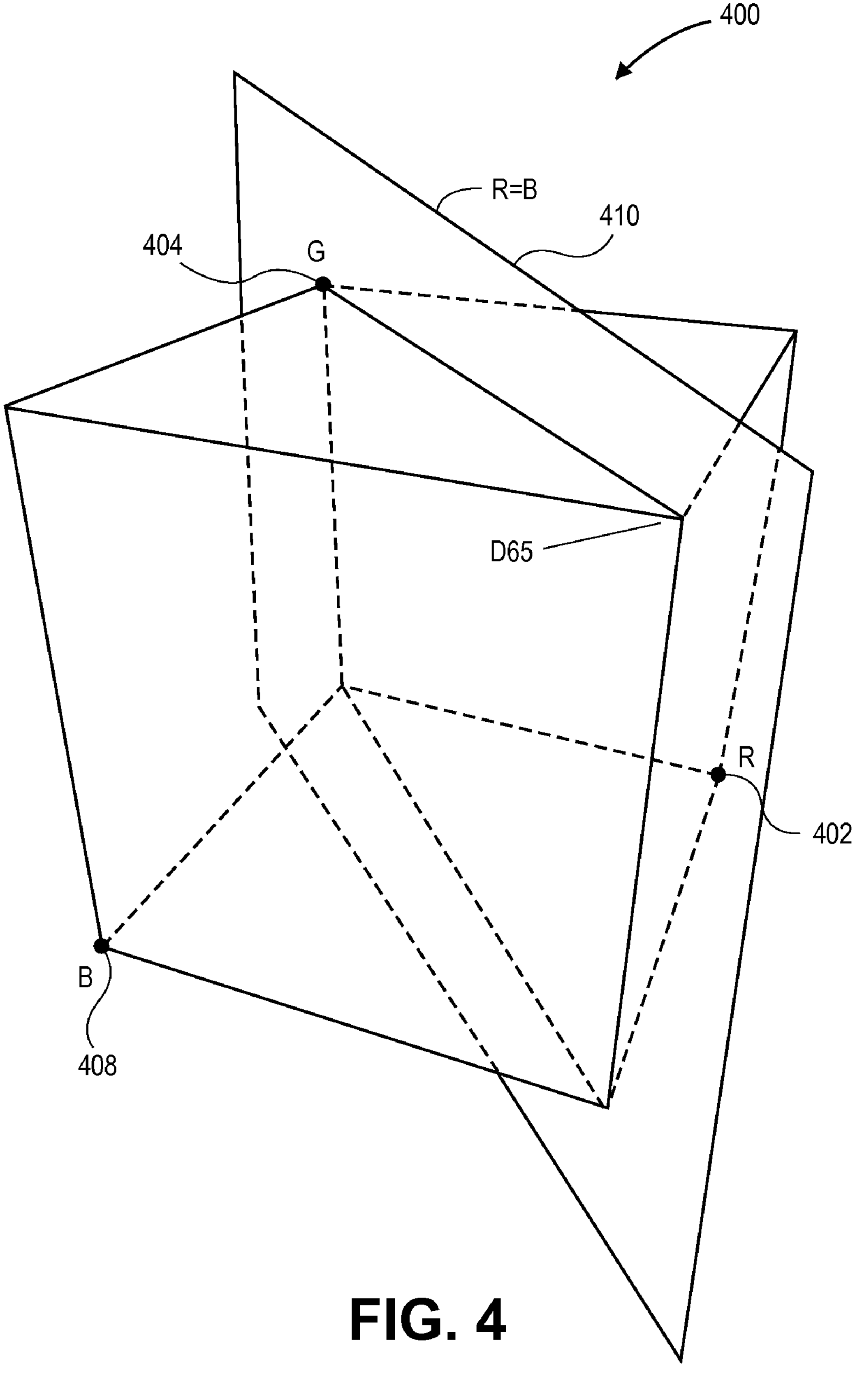
FIG. 4 shows a slice through the RGB color cube.

Other such Boolean triangle tests are similarly constructed. FIG. 4 depicts three-dimensional representation of the RGB color space 400 defined by color primary points: red 402, green 404, and blue 408. The Boolean tests divide the sRGB color space into halves along planes in 3-space—for example, plane 410 represents an imaginary plane wherein color points have R components equal to B components (i.e. R=B). The first test, R<=B, tests for all the input colors on one side of the plane that has the formula R=B, the second formula divides the colors into all the colors above the plane that has the formula G=B. Both of these planes pass through black (0,0,0) white (255,255,255) and one of the primary colors (e.g. green 404). The intersection of the two half-space volumes above these planes is a volume that contains all the colors inside one chromaticity triangle.

Figure 5:
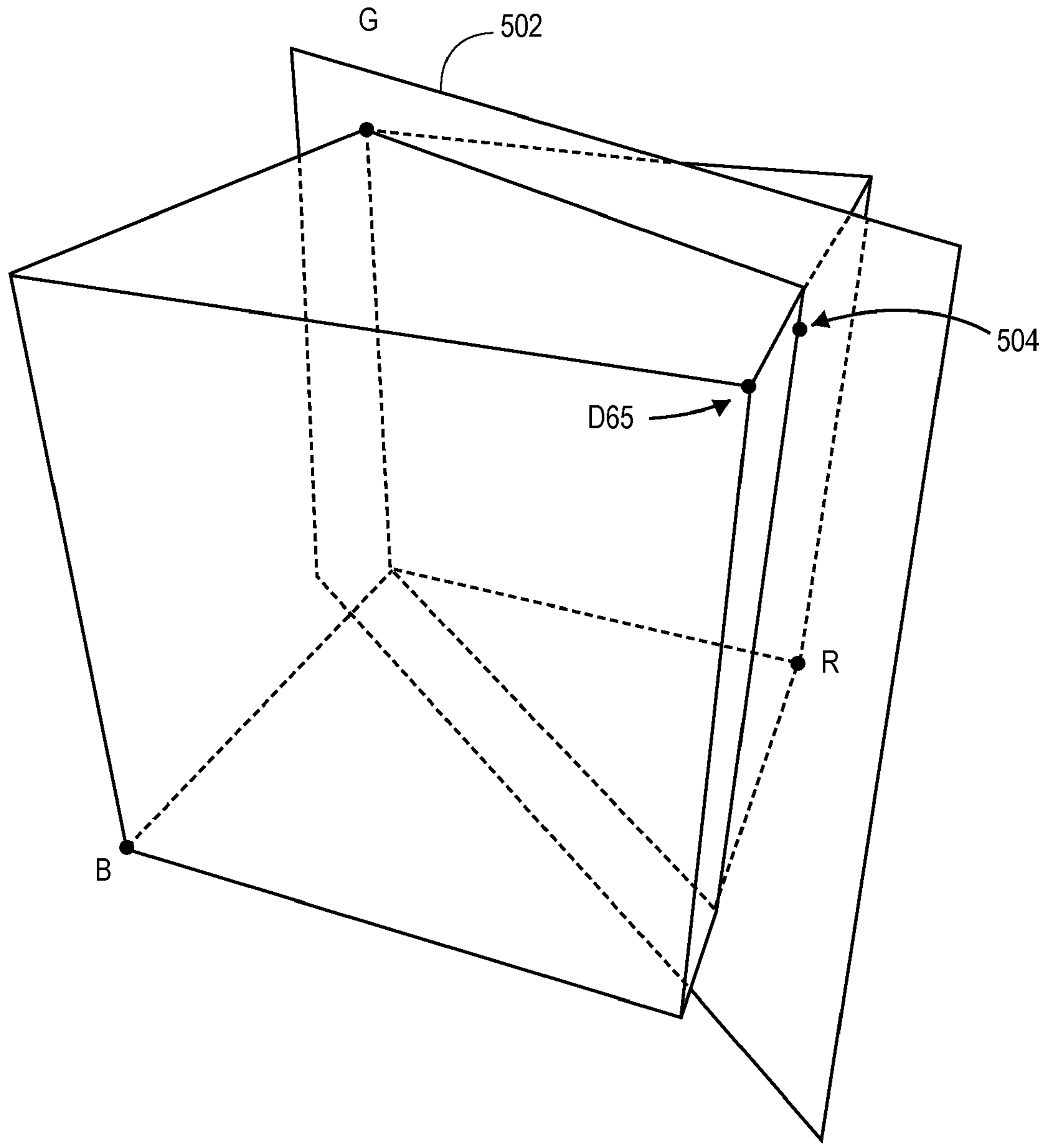
FIG. 5 shows a corrected slice through the RGB color cube.

Using the general formula for a plane in 3D, it is possible to construct the formula for planes that pass through other white-points besides D65. For example, FIG. 5 shows a different plane 502 which cuts through point 504 (e.g. the measured white point AW). This would correct the calculations for displays with a white-point that did not match the D65 assumption of input data. Further, it is possible to generate formula for planes that pass through other primary colors besides the Rec. 709 standard R G and B points. It is also possible to add more planes and find the chromaticity triangle number with any number of primary colors in a multi-primary display. Equation 10 below is the three-point formula for a plane in 3-space.

$$\left\|\begin{pmatrix} r & g & b & 1 \\ r_1 & g_1 & b_1 & 1 \\ r_2 & g_2 & b_2 & 1 \\ r_3 & g_3 & b_3 & 1 \end{pmatrix}\right\| = 0 \qquad \text{Equation 10}$$

This determinant is zero for all points that lie on the plane. If the = sign is replaced with an inequality such as >= the formula splits 3-space into two halves. In one embodiment, the planes may pass through black (0,0,0), through one of the primaries, and through the white point. Plugging in 255 for each primary and (255,255,255) for the white point are one possible set of assumptions for the Boolean formula:

$$\left\|\begin{pmatrix} r & g & b & 1 \\ 0 & 0 & 0 & 1 \\ 255 & 255 & 255 & 1 \\ 255 & 0 & 0 & 1 \end{pmatrix}\right\| = 0 \qquad g - b = 0 \qquad \text{Equation 11r}$$

$$\left\|\begin{pmatrix} r & g & b & 1 \\ 0 & 0 & 0 & 1 \\ 255 & 255 & 255 & 1 \\ 0 & 255 & 0 & 1 \end{pmatrix}\right\| = 0 \qquad b - r = 0 \qquad \text{Equation 11g}$$

$$\left\|\begin{pmatrix} r & g & b & 1 \\ 0 & 0 & 0 & 1 \\ 255 & 255 & 255 & 1 \\ 0 & 0 & 255 & 1 \end{pmatrix}\right\| = 0 \qquad r - g = 0 \qquad \text{Equation 11b}$$

Equations 11r, 11g, and 11b reproduce the Boolean tests. It is then possible to substitute different values for the white point and make the formula work correctly when the white point is not the standard one. Since the Boolean tests may be done in the input color space, it may desirable, in one embodiment, to translate the AW measured white point backwards into the sRGB space. From the CIE XYZ values of AW, the inverse of the standard conversion matrix in Equation 3 may perform this, or, alternatively, the inverse of the transform done in Equation 9 from the values (255,255,255). Using the example AW measured values from an RGBW display, if AW is converted and gamut clamped to sRGB, the result is W=(255, 243, 135). It is possible to write down a general formula for any white point:

$$\left\|\begin{pmatrix} r & g & b & 1 \\ 0 & 0 & 0 & 1 \\ W_r & W_g & W_b & 1 \\ 255 & 0 & 0 & 1 \end{pmatrix}\right\| = 0 \qquad g \cdot W_b - W_g \cdot b = 0 \qquad \text{Equation 12r}$$

$$\left\|\begin{pmatrix} r & g & b & 1 \\ 0 & 0 & 0 & 1 \\ W_r & W_g & W_b & 1 \\ 0 & 255 & 0 & 1 \end{pmatrix}\right\| = 0 \qquad W_r \cdot b + r \cdot W_b = 0 \qquad \text{Equation 12g}$$

$$\left\|\begin{pmatrix} r & g & b & 1 \\ 0 & 0 & 0 & 1 \\ W_r & W_g & W_b & 1 \\ 0 & 0 & 255 & 1 \end{pmatrix}\right\| = 0 \qquad r \cdot W_g - W_r \cdot g = 0 \qquad \text{Equation 12b}$$

It should be noted that one possible difference between the simplified versions of Equations 12r, 12g, and 12b and the Boolean tests is that the input color values are multiplied by the converted white point values. However, these 6 multiplication operations are less than the 9 required to do the matrix operation described in Equation 9. Thus, the Boolean test may at times be less computationally expensive than the hue angle method of calculating the chromaticity triangle number.

In both Equations 11 and 12, the primaries are assumed to be at the corners of the sRGB input system. This restriction tends to prevent the Boolean test from working on displays with more than three primaries. This is, however, an artificial restriction that may be lifted, in one embodiment, by using the measured color of each primary. For example, if a display had a cyan primary, the inverse matrix from Equation 3 might convert that primary into a color C in the sRGB space. This color might then be substituted into Equation 10 along with (0,0,0) for black and the converted white point W as used in Equations 12.

$$\left\|\begin{pmatrix} r & g & b & 1 \\ 0 & 0 & 0 & 1 \\ W_0 & W_1 & W_2 & 1 \\ C_0 & C_1 & C_2 & 1 \end{pmatrix}\right\| = 0 \qquad \text{Equation 13}$$

$$(W_1 \cdot C_2 - C_1 \cdot W_2) \cdot r + (-W_0 \cdot C_2 + C_0 \cdot W_2) \cdot g + (W_0 \cdot C_1 - C_0 \cdot W_1) \cdot b = 0$$

It should be noted that the calculations using the W and C values can be done beforehand so this calculation may only need 3 multiplies per primary. An equation like this may be generated for each of the primaries, no matter how many primaries there are in the multi-primary system. This allows the Boolean test to be extended to displays with any number of primaries. It should also be noted that if some of the primaries are reasonably close to the standard primaries of sRGB then the simpler formula of Equations 12 may be used and fewer multiplies may be performed. Finally if the white point of the display is reasonably close to D65 then the Equations 11 can do some of the tests with no multiplies.

To build the Boolean expressions to detect each chromaticity triangle, since all the planes intersect the line of grays, it is noted that only two planes suffice to be tested for each chromaticity triangle—e.g. the two that pass through two adjacent primaries. The equations of the planes may then be converted into half-space volumes by changing them from =0 to >=0 or <=0. The union of the two resulting inequalities may constitute the test for a specific chromaticity triangle. It may also suffice to test any choice by generating a list of points inside the chromaticity triangle in a test program then creating a scatter-plot of them with a 3D plotting program.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. For a display device, a method for changing the chromaticity triangle calculations of input image data, the method comprising:

converting input image data to a first color space, said first color space having the same white point as a white point of the display device; and calculating the chromaticity triangle of the converted input image data, wherein the input image data are converted into values that have the same white point as the display device, and the converted values have their chromaticity triangles calculated.

2. The method of claim 1 wherein said input image data is in sRGB format.

3. For a display device, a method of calculating chromaticity triangles of input image data, the method comprising:

constructing a plurality of Boolean tests to determine the chromaticity triangle of any input image data; and applying a correction for said Boolean tests depending upon a white point of the display device.

* * * * *